(12) United States Patent
Sorin et al.

(10) Patent No.: US 9,759,777 B2
(45) Date of Patent: Sep. 12, 2017

(54) MONITORING DEVICE COMPRISING A MANAGEMENT OF BATTERY DISCHARGE AND METHOD OF BATTERY DISCHARGE MANAGEMENT

(71) Applicant: SCHNEIDER ELECTRIC INDUSTRIES SAS, Rueil-Malmaison (FR)

(72) Inventors: Joel Sorin, Domene (FR); Bertrand Masseboeuf, Beaucroissant (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 322 days.

(21) Appl. No.: 14/665,351

(22) Filed: Mar. 23, 2015

(65) Prior Publication Data

US 2015/0270725 A1    Sep. 24, 2015

(30) Foreign Application Priority Data

Mar. 24, 2014    (FR) ..................................... 14 00711

(51) Int. Cl.
*H01M 10/44* (2006.01)
*H01M 10/46* (2006.01)
(Continued)

(52) U.S. Cl.
CPC ........... *G01R 31/362* (2013.01); *G01R 31/40* (2013.01); *H01M 10/425* (2013.01); *H01M 10/48* (2013.01); *G01R 19/16542* (2013.01); *H01M 2010/4271* (2013.01); *H02H 1/06* (2013.01); *H02J 7/0063* (2013.01); *H02J 2007/0067* (2013.01)

(58) Field of Classification Search
CPC ...... H02J 7/0021; H02J 7/0026; H02J 7/0034; H02J 7/0036
USPC ............... 320/112, 121, 127, 132, 135, 136; 307/43, 48, 64, 66
See application file for complete search history.

(56) References Cited

U.S. PATENT DOCUMENTS

| 4,839,248 A | 6/1989 | Magnussen, Jr. et al. |
| 5,089,928 A | 2/1992 | Durivage, III et al. |

(Continued)

FOREIGN PATENT DOCUMENTS

| DE | 29 36 675 A1 | 3/1981 |
| EP | 0 279 692 A2 | 8/1988 |

(Continued)

*Primary Examiner* — Edward Tso
(74) *Attorney, Agent, or Firm* — Oblon, McClelland, Maier & Neustadt, L.L.P.

(57) ABSTRACT

The monitoring device of an electric power supply is supplied by this electric power supply. It comprises a battery (3) forming a secondary power supply and which is triggered in case of outage of the primary power supply. A management circuit monitors the voltage at the terminals of the battery. A comparator compares the measured voltage at the terminals of the battery with first and second threshold values. A management circuit commands flow of a discharge current at the terminals of the battery, by means of a switch and of a counter configured to count a quantity representative of the discharge current. The management circuit can inform the user that the battery is defective according to the value of the counter.

8 Claims, 4 Drawing Sheets

(51) Int. Cl.

| | |
|---|---|
| *G01R 31/36* | (2006.01) |
| *G01R 31/40* | (2014.01) |
| *H01M 10/48* | (2006.01) |
| *H02J 7/00* | (2006.01) |
| *G01R 19/165* | (2006.01) |
| *H01M 10/42* | (2006.01) |
| *H02H 1/06* | (2006.01) |

(56) References Cited

U.S. PATENT DOCUMENTS

| | | | |
|---|---|---|---|
| 5,224,011 A | | 6/1993 | Yalla et al. |
| 5,444,378 A | * | 8/1995 | Rogers ............... G01R 31/3613 |
| | | | 320/136 |
| 6,118,251 A | | 9/2000 | Atwater |
| 2004/0124709 A1 | * | 7/2004 | Eisenberger ............ H02J 9/061 |
| | | | 307/29 |
| 2013/0308239 A1 | | 11/2013 | Yamada et al. |

FOREIGN PATENT DOCUMENTS

| | | |
|---|---|---|
| EP | 0 444 023 A1 | 9/1991 |
| EP | 0 891 000 A2 | 1/1999 |
| EP | 0 948 828 A1 | 10/1999 |
| EP | 2 557 651 A2 | 2/2013 |
| GB | 2 292 249 A | 2/1996 |
| JP | 2003-67091 | 3/2003 |
| WO | WO 2014/044933 A2 | 3/2014 |

* cited by examiner

MONITORING DEVICE COMPRISING A MANAGEMENT OF BATTERY DISCHARGE AND METHOD OF BATTERY DISCHARGE MANAGEMENT

BACKGROUND OF THE INVENTION

The invention relates to a monitoring device of an electric power supply comprising main and secondary power supplies.

The invention also relates to a method for performing management of discharge of a battery securing the power supply of a monitoring device.

STATE OF THE ART

The primary power supply of a control circuit can be interrupted in certain accidental cases. It is interesting to know the state of the control circuit or of data present in the control circuit when the latter shuts down due to a power supply outage. In order to store certain interesting data, the control circuit possesses a data storage circuit.

To ensure operation of the storage circuit before and after outage of the primary power supply, a secondary electric source is connected to the storage circuit enabling the electric power necessary for correct operation of the storage circuit to be supplied.

In traditional manner, this secondary power source is an electric battery which must be permanently ready to supply the control circuit.

The document U.S. Pat. No. 5,224,011 discloses a system where a battery is used to perform backup of data in an electric circuit in case of a main power supply outage.

The document U.S. Pat. No. 5,089,928 uses a backup battery to ensure operation of a LCD after outage of the main power supply of the system. The battery is activated manually.

However, the lifetime of the battery is limited which requires monitoring of the state of the battery in order to indicate its end of life.

Certain documents exist which deal with this issue. For example purposes, the document EP0279692 describes a system using an electric battery to ensure operation of a control circuit. The state of the battery is checked manually by activation of a test circuit comprising a LED which indicates the voltage measured at the terminals of the battery.

During the waiting period, one of the terminals and/or one of the internal electrodes of the battery may oxidize. It is then advantageous to perform a deoxidization action to make the battery operational again.

In the case where the terminals of the battery are passivated, the document U.S. Pat. No. 6,118,251 describes a method for performing depassivation of an electric battery by sequences of electric pulses.

The document EP0444023 describes a system for performing depassivation of an electric battery by monitoring the power delivered by the battery until the salt crystals on an electrode have been dissipated and power delivery has returned or until a maximum period of time has elapsed.

The document EP0891000 describes a method for checking the state of an electric battery before its use and enables depassivation of the battery as well as calculation of the residual lifetime of the battery.

OBJECT OF THE INVENTION

The object of the invention is to provide a monitoring device having a secondary power supply and which proposes a better quality of service, in particular when performing detection of a malfunction.

The monitoring device of an electric power supply system comprises:
  a series of first terminals designed to be connected to a primary power supply,
  a battery connected to supply the monitoring device as secondary power supply, in case of outage of the primary power supply,
  measuring means configured to measure the voltage at terminals of the battery,
  a management circuit to detect a malfunctioning of the battery,
  a comparator configured to compare the voltage measured by the measuring means with first and second threshold values, an output of the comparator being connected to the management circuit,
  a switch configured to disable/enable flow of a discharge current at the terminals of the battery,
  a counter configured to count a quantity representative of the discharge current, an output of the counter being connected to the management circuit,
wherein the management circuit is configured to control the state of the switch according to the comparison of the measured voltage with the first and second threshold values and according to the value of the counter.

It is a further object of the invention to provide a method for performing management of discharge of a battery in a monitoring device that is easy to implement while at the same time ensuring dependable and repeatable achievement for industrial integration.

The management method of discharge of an electric power supply is characterized in that it comprises the following steps:
  providing a monitoring device of an electric power supply equipped:
    with a first series of terminals designed to be connected to a primary electric power supply,
    with a storage circuit configured to record indicators linked to the measured electric quantities of the electric power supply,
    with a battery connected to supply at least a part of the storage circuit in case of outage of the primary electric power supply,
    with measuring means configured to measure the voltage at the terminals of the battery,
    with a management circuit connected to the measuring means and configured to detect a malfunctioning of the battery,
  detecting the presence of the battery,
  measuring the voltage at the terminals of the battery,
  comparing the voltage measured at the terminals of the battery with first and second threshold values,
  applying a discharge current to the terminals of the battery if the measured voltage is comprised between the first and second threshold values.

BRIEF DESCRIPTION OF THE DRAWINGS

Other advantages and features will become more clearly apparent from the following description of particular embodiments of the invention given for non-restrictive example purposes only and represented in the appended drawings, in which.

DETAILED DESCRIPTION

Figure 1A:
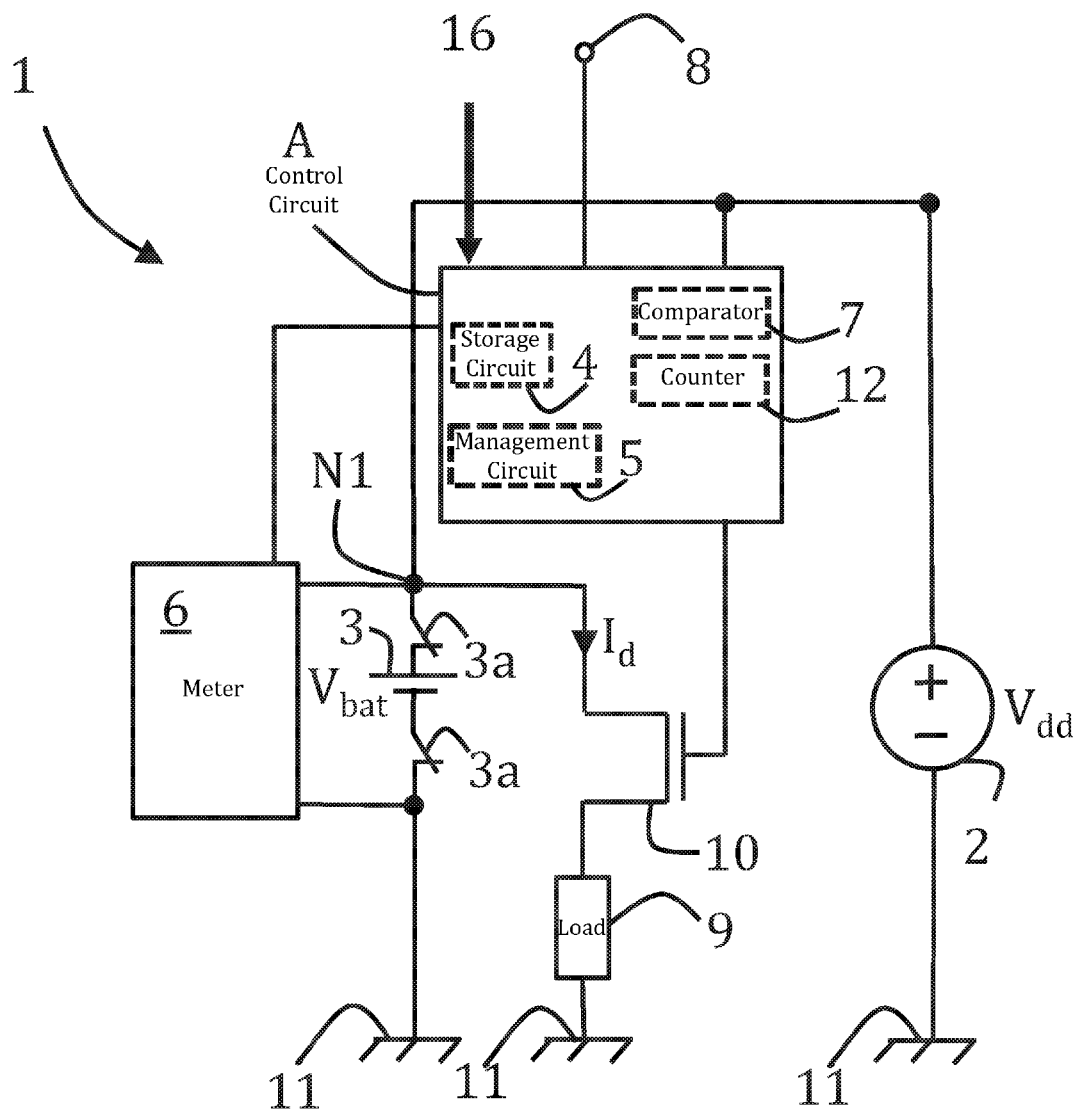
FIGS. 1a and 1b represent two embodiments of a monitoring device, in schematic manner.

FIG. 1a illustrates a monitoring device 1, for example a circuit breaker, configured to monitor one or more electric power supply lines. Monitoring device 1 is designed to be connected to the electric power supply lines and configured to measure the electric characteristics of the lines, for example the voltage present on the line and/or the current flowing in the electric line. In the case of a circuit breaker, interruption of the monitored power supply line may occur in case of detection of a malfunction.

Monitoring device 1 comprises a series of power supply terminals designed to be connected to a primary power supply source 2. The primary power supply source is the main power supply source, i.e. it supplies for the most part or first and foremost the different components of monitoring device 1.

In order to palliate a failure of main power supply source 2, monitoring device 1 comprises a second power supply source 3 which is formed by a battery. Battery 3 comprises two contacts 3a which connect battery 3 to the component elements of monitoring device 1. Battery 3 is configured to supply at least a part of the monitoring device and preferably only a part of the monitoring device. The monitoring device monitors a supply line which can be the main power supply line coming from the main power supply source or another supply line different from the battery.

In advantageous manner, all the electronic circuitry or only a part of the electronic circuitry of monitoring device 1 is supplied by battery 3 in order to preserve a large autonomy in case of outage of main power supply 2.

In a particular embodiment, monitoring device 1 comprises a storage circuit 4 which records indicators linked to the measured electric quantities. In advantageous manner, battery 3 supplies at least storage circuit 4. In the case of a circuit breaker, storage circuit 4 preferably records indicators linked to the causes of tripping of the circuit breaker.

What is meant by battery 3 is an electrochemical device which converts chemical energy into electric energy by means of a chemical redox reaction. The battery may be non-rechargeable and be referred to as a non-reusable battery or electric battery. In other embodiments, the battery can be rechargeable.

Secondary power supply source 3 is placed in monitoring device 1 so as to prevent a new series of power supply lines dissociated from the first series of power supply lines from being installed. In this way, it is possible to have a monitoring device 1 that is compact and that ensures almost permanent operation.

As monitoring device 1 can be placed in aggressive environments, it is advantageous to have a secondary power supply source 3 that is also able to withstand such conditions.

In an advantageous embodiment, monitoring device 1 is configured in such a way that primary power supply source 2 is the power supply line to be monitored or is connected to the power supply line to be monitored. The power supply line to be monitored is designed to supply one or more other electric loads. If monitoring device 1 detects a malfunction on the power supply line, it will cause disconnection of the line which will result in unavailability of primary power supply source 2.

Thus, in this configuration, when the power supply line to be monitored is shut down, main power supply 2 is unavailable and it is necessary to switch to secondary power supply 3.

In the embodiment represented in FIG. 1a, monitoring device 1 advantageously comprises a control circuit A which is configured to analyse the power supply line to be monitored, for example by means of a microcontroller. Storage circuit 4 is connected to the control circuit. In the embodiment illustrated in FIG. 1, storage circuit 4 forms part of control circuit A.

Control circuit A or a part of the control circuit (in particular storage circuit 4) is preferably supplied by battery 3 in case of outage of main power supply 2.

Monitoring device 1 further comprises a management circuit 5 configured to analyse the state of the battery 3 and particularly to detect a possible failure of battery 3. The management circuit is configured to detect failure of battery 3 when the monitoring device is supplied by its main power supply.

The use of a management circuit 5 which checks the state of battery 3 makes it possible to know, in the course of time, whether secondary power supply source 3 is able to supply the control circuit and therefore to ensure satisfactory operation of monitoring device 1. Voltage at the terminals of the battery is measured when the monitoring device is supplied by the main power supply.

Measuring means 6 are configured to measure the voltage $V_{bat}$ at the terminals of battery 3. Measuring means 6 are connected to an input of a comparator 7 to provide the latter with information relative to the state of battery 3, by means of the voltage $V_{bat}$. Comparator 7 is connected to management circuit 5 so as to be able to transmit one or more signals to the latter. In the illustrated example, management circuit 5, comparator 7 and storage device are formed in control circuit A which is for example a microcontroller.

Figure 3:
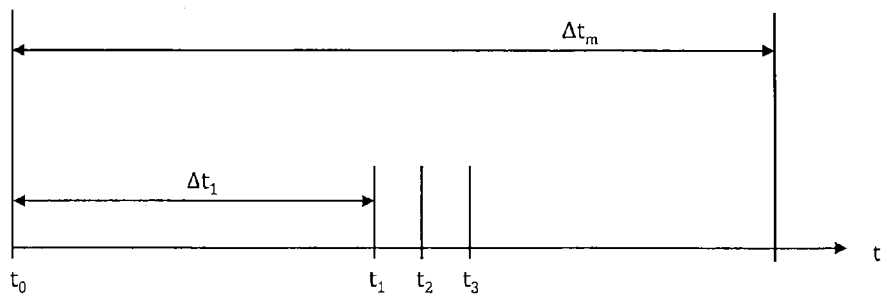
FIG. 3 represents the times and cycles patterning the progression of the current delivered by the battery in the scope of a management method of discharge of the battery.

Measuring means 6 can be configured to perform measurement of the voltage at the terminals of battery 3 in periodic planner, a period symbolized by $\Delta t_m$ in FIG. 3, for example by means of a clock. It is also possible to perform measurement of battery 3 on receipt of a measurement signal. The term measured voltage $V_{bat}$ can represent the voltage at the terminals of battery 3 or a quantity representative of this voltage. In a particular embodiment, the voltage at the terminals of battery $V_{bat}$ is measured every 24 h, i.e. $\Delta t_m = 24$ h.

Comparator 7 is configured to compare the measured voltage $V_{bat}$ with a first threshold $V_{OFF}$ and with a second threshold $V_{min}$. The second threshold $V_{min}$ is higher than the first threshold $V_{OFF}$.

The value of the second threshold $V_{min}$ corresponds to a functional battery 3. Thus, if the measured voltage $V_{bat}$ is greater than the second threshold value $V_{min}$, comparator 7 transmits first data representative of this comparison to management circuit 5 and battery 3 is considered as being functional.

The interval comprised between the first threshold value $V_{OFF}$ and second threshold value $V_{min}$ corresponds to a battery 3 that may possibly present a problem that is able to be corrected. Thus, if the measured voltage $V_{bat}$ is comprised within this interval, comparator 7 sends associated second data to management circuit 5.

The value of the first threshold $V_{OFF}$ corresponds to a defective battery 3 that is unrepairable. Thus, if the measured voltage $V_{bat}$ is lower than the first threshold value $V_{OFF}$, comparator 7 transmits third data representative of this comparison and battery 3 is considered as being defective by management circuit 5. Battery 3 has for example to be replaced.

If management circuit 5 receives the first data, it can store this data in a memory. The first data can be the absence of a signal.

If management circuit 5 receives the third data, it can inform the user that battery 3 is defective and that replacement of the latter has to be scheduled in order to maintain operation of monitoring device 1 with all its performances. Indication of a defective battery can be performed by means of a light indicator, for example by means of a light-emitting diode. It is also possible to use an electromagnetic wave or an electronic signal to inform the user of malfunctioning of battery 3. For example, management circuit 5 indicates the end of life of battery 3 by means of an output 8.

If management circuit 5 receives the second data, it engages a test protocol in order to determine whether battery 3 is functional or defective.

Management circuit 5 is connected to an electric load 9 configured to discharge battery 3. Under these conditions, an electric current flows from battery 3 to electric load 9 (through terminals 3a of battery 3).

Partial discharge of battery 3 is thus triggered when the measured voltage $V_{bat}$ at terminals 3a of battery 3 is greater than the first threshold $V_{OFF}$ and lower than the second threshold $V_{min}$.

Discharge of battery 3 is triggered by management circuit 5 which defines the discharge conditions, for example the current density, the duration of the current, the quantity of electric charges transferred by battery 3, the form of the current in time (intensity versus time) and/or the number of repetitions of a discharge current defining a pattern.

A discharge current $I_d$ is emitted from battery 3, and the discharge current $I_d$ is configured to at least partially eliminate a passivation layer present on a terminal or one of the internal electrodes of battery 3.

For example, the discharge current $I_d$ is in the form of several pulses of square shape.

In one embodiment, management circuit 5 is connected to the control electrode of a switch 10. Switch 10 electrically connects the two terminals 3a of battery 3 or it connects one of terminals 3a of battery 3 to a reference potential 11 which is able to drain the electric loads. This embodiment is advantageous as it is compact and enables flow of the current from battery 3 to be easily controlled.

In an even more particular embodiment, switch 10 is a transistor. Transistor 10 enables a discharge current $I_d$ to transit from the anode of battery 3 to reference potential 11 through electric load 9. Reference potential 11 is for example the ground. The use of a transistor 10 associated with electric load 9 enables an extremely compact device to be achieved while at the same time achieving good control of the quantity of current to be made to transit. Transistor 10 enables the flow time of the current to be fixed and electric load 9 enables the current intensity to be fixed.

Monitoring device 1 advantageously comprises a counter 12 which is configured for monitor a quantity representative of flow of the electrons, i.e. a quantity representative of the electric charge carriers during the multiple activations of the discharge current. This quantity allows the number of charges used for removing the passivation layer at the terminal of the battery to be known.

For example, monitoring device 1 advantageously comprises a counter 12 which is configured to measure the quantity of current flowing through terminals 3a of battery 3 or to count the number of passages of a current flowing through terminals 3a of battery 3. Counter 12 can be a counter which receives data from management circuit 5 indicating triggering of a discharge current $I_d$. Counter 12 then records the number of iterations of application of discharge current $I_d$. Counter 12 can also be a counter measuring activation of the control electrode of switch 10. Counter 12 can further be a device measuring the current $I_d$ flowing through battery 3. The recorded data is then a quantity of electrons that have transited via terminals 3a of battery 3.

In a particular embodiment, management circuit 5 is connected to counter 12. Management circuit 5 is configured to indicate failure of battery 3 if the second data is sent by comparator 7 and if counter 12 presents a higher value than a critical value $N_C$. Under these conditions, it has been detected that the voltage $V_{bat}$ at the terminals of battery 3 is within the interval where the test protocol has to be applied and counter 12 indicates that the test protocol has already been applied several times. It therefore seems that the voltage drop is not linked to a passivation layer or that the flow of a current at the terminals of battery 3 is not sufficient to break the passivation layer. Emission of a failure signal makes it possible to anticipate an aggravation of the situation where battery 3 will no longer be able to supply a sufficient voltage to supply the control circuit or at least storage circuit 4.

This configuration enables a battery 3 which will not be functional to be detected more rapidly and this enables certain passivated batteries 3 to be reactivated without the intervention of a user.

In a particular embodiment, measuring circuit 6 is configured to measure the voltage $V_{bat}$ at the terminals of battery 3 as soon as a battery 3 has just been installed.

Under these conditions, a newly fitted battery 3 is automatically detected which enables the user to know immediately whether the new battery 3 intrinsically presents a problem. The situation is therefore prevented where a user who has just fitted a new battery has to come back and change this battery which is defective.

It is advantageous to provide a monitoring device devoid of a battery charger supplied by the main power supply so as to increase compactness.

Measuring circuit 6, comparator 7 and management circuit 5 can be formed by different electronic circuits or they can at least be formed partially in one and the same electronic circuit for example the control circuit A and in particular by a microcontroller.

The use of a microcontroller to form at least a part of management circuit 5, measuring circuit 6, comparator 7 and/or counter 12 is advantageous as this means that the device is compact and consumes little electric power.

Figure 1B:
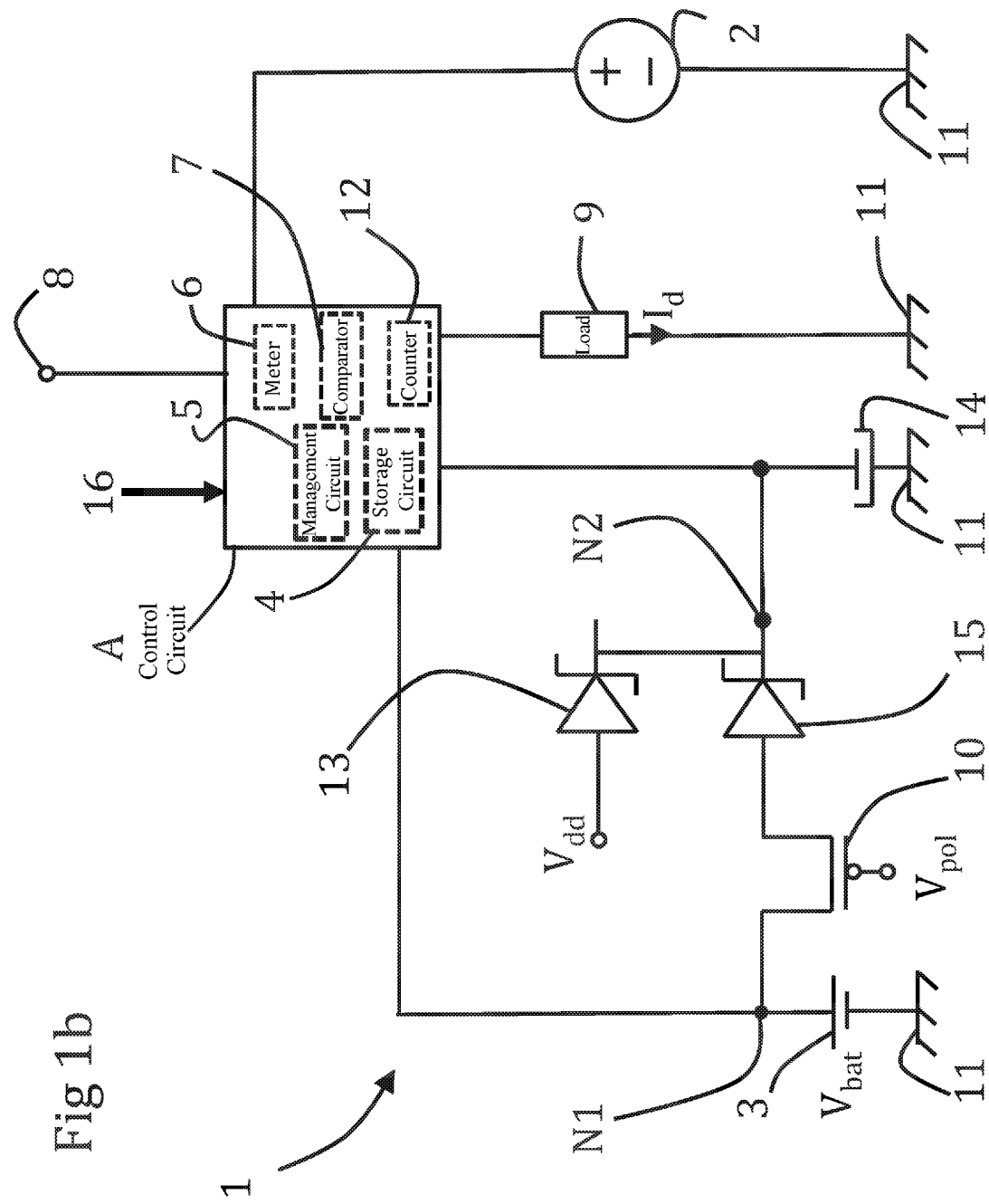

In a particular configuration represented in FIG. 1b, the primary electric power supply source 2 applies a supply voltage $V_{dd}$ to monitoring device 1 via a first diode 13. This configuration is particularly advantageous when the primary power supply is provided by the power supply line to be monitored which is an alternating or direct current power supply. This configuration can also be applied to the device according to FIG. 1a.

The voltage $V_{dd}$ is applied to the anode of first diode 13. First diode 13 is arranged to supply management circuit 5. The cathode of first diode 13 is here connected to the input of control circuit A.

In an advantageous embodiment, first diode 13 is also connected to a first terminal of a decoupling capacitor 14 configured to smooth the voltage applied by the power supplies. A second terminal of decoupling capacitor 14 is connected to the reference potential 11, here the ground. Power supply of management circuit 5 by primary source 2 enables electric battery 3 to be economised, the latter only coming into operation in case of an outage of primary source 2.

The same is advantageously the case for the other elements involved in monitoring the state of battery 3 i.e. measuring circuit 6, counter 12 and comparator 7.

The anode of battery 3 is connected to the source of transistor 10. Management circuit 5 applies a voltage $V_{pol}$ to the gate of said transistor 10, which enables flow of a current from battery 3 to be commanded (FIG. 1b).

In the illustrated example, the drain of transistor 10 is connected to the anode of a second diode 15. The cathode of diode 15 is connected to the input of control circuit 4. The electric connection between the two diodes 13 and 15 with decoupling capacitor 14 defines a second node $N_2$. For example purposes, transistor 10 is a P-type MOSFET transistor.

In an advantageous embodiment, supply voltage $V_{dd}$ provided by primary power supply 2 is about 3.3V with a tolerance of plus or minus 5%. The electric voltage $V_{bat}$ of battery 3 is about 3.6V for a fully charged battery 3.

In one embodiment, decoupling capacitor 14 is a capacitor having a capacitance of about $C_d$=0.1 µF.

In a particular configuration, first diode 13 and second diode 15 are Schottky or silicon diodes having a weak forward voltage.

In a particular operating mode illustrated in FIG. 1b, the discharge current flows through control circuit A. Electric load 9 is connected between control circuit A and reference potential 11. For example, an electric resistance of about 1 kΩ can be used to form electric load 9. In this case, a discharge current $I_d$ of about 3 mA is advantageous to ensure degradation of the passivation layer. The discharge current is advantageously equal to 3 mA, which corresponds with the variations of achievements at a current comprised between 2.7 and 3.3 mA.

In this configuration, a first electric node $N_1$ is defined by the connection of the anode of battery 3 with the terminal of the source of transistor 10 and the power supply input of control circuit A. The voltage $V_{bat}$ of battery 3 can be measured at node $N_1$ by measuring means 6. A second electric node $N_2$ is defined by the connection of the cathode of first diode 13 with the cathode of second diode 14 and the second input of the control circuit. A terminal of decoupling capacitor 14 is also connected to node $N_2$.

Figure 2:
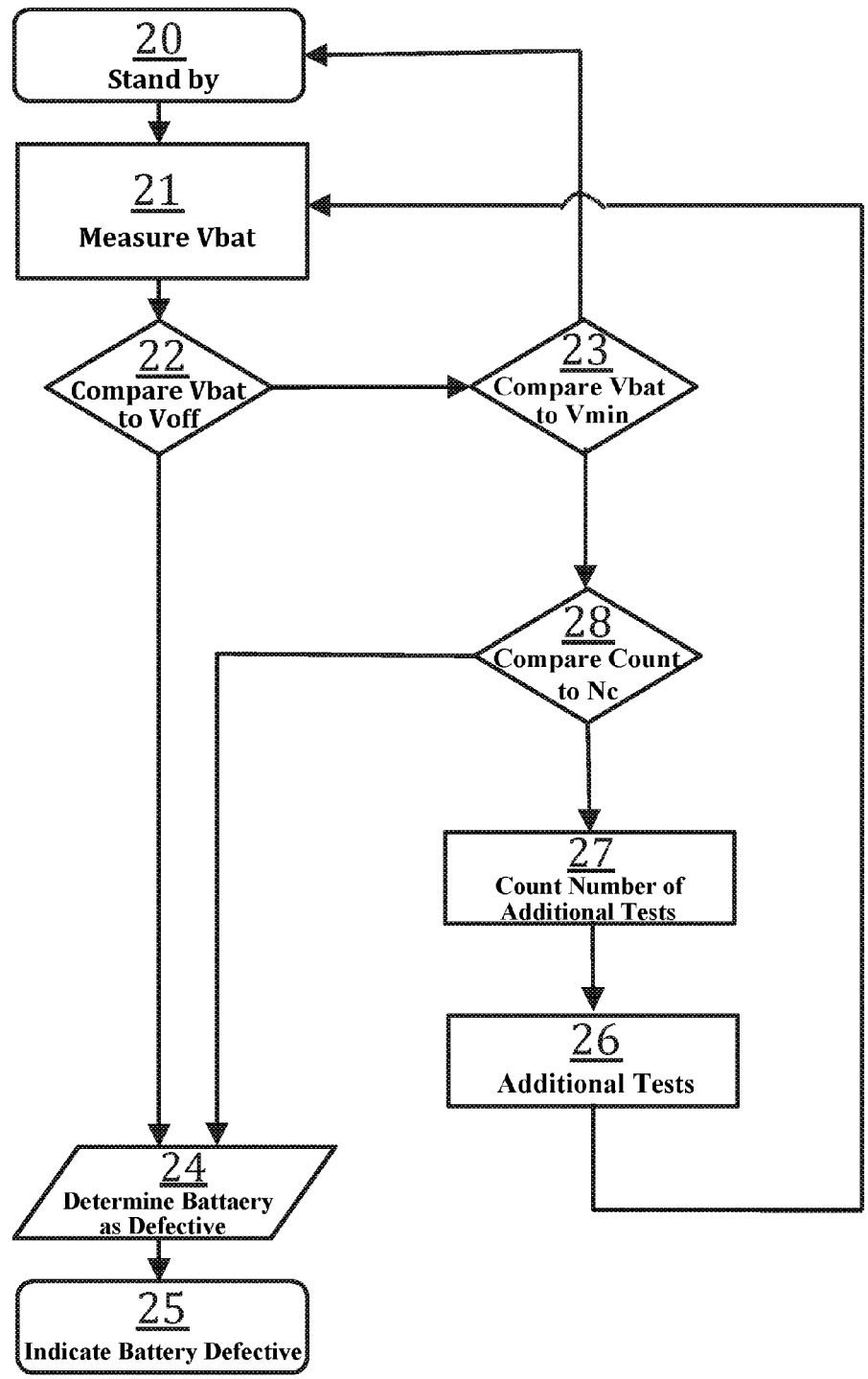
FIG. 2 represents a flowchart of the steps for performing management of the state of the battery.

In operation, monitoring device 1 can apply the monitoring protocol of the state of battery 3 which is laid out in the following and illustrated in FIG. 2.

The beginning of the process is represented by step 20, battery 3 is present and monitoring device 1 is supplied either by battery 3 or by primary power supply source 2. Step 20 can be considered as being a standby state.

A measurement order is emitted to initiate measurement of the voltage $V_{bat}$ at terminals 3a of battery 3. Advantageously, measurement of the voltage $V_{bat}$ is performed by making a current flow through the load.

In a step 21, the voltage $V_{bat}$ at the terminals of battery 3 is measured by measuring means 6. Preferably, measurement of the voltage $V_{bat}$ can be performed by successive multiple measurements, which enables for example a mean of the voltage $V_{bat}$ to be calculated in order to obtain a more reliable value of $V_{bat}$.

In a step 22-23, the measured voltage $V_{bat}$ is compared with the first and second threshold values $V_{min}$ and $V_{OFF}$.

In step 22, the measured voltage $V_{bat}$ is compared with the first threshold value $V_{OFF}$ ($V_{bat}$<$V_{OFF}$ ?).

If the voltage $V_{bat}$ is lower than the first threshold value $V_{OFF}$ ($V_{bat}$<$V_{OFF}$), battery 3 is considered as being defective (step 24) and it is advantageous to replace it.

Advantageously, detection of the defective state is associated with indication of this state to the user (step 25).

Following this indication event, the management method can be terminated by a waiting phase for replacement of battery 3. Indication can be performed for example with an advantageously discrete signal sent by output 8 to a light-emitting diode or with a digital or analog signal sent to another component part of the monitoring device. In a particular embodiment, the threshold value $V_{OFF}$ is for example equal to 2.3V.

If the voltage $V_{bat}$, in step 22, is higher than the first threshold value $V_{OFF}$ ($V_{bat}$>$V_{OFF}$), the measured voltage $V_{bat}$ is compared with the second threshold value $V_{min}$. In step 23, the measured voltage $V_{bat}$ is compared with the second threshold value $V_{min}$ ($V_{bat}$>$V_{min}$ ?).

If the voltage $V_{bat}$ is higher than the second threshold value $V_{min}$ ($V_{bat}$>$V_{min}$), battery 3 is considered as being functional. This information can be stored in memory.

The management method then returns to a standby state (step 20) or it restarts a measurement step of the voltage $V_{bat}$ (step 21). In advantageous manner, the monitoring method returns to initial state 20 and waits for a new measurement order in order to avoid placing too much strain on battery 3.

If the voltage $V_{bat}$ is lower than the second threshold value $V_{min}$ ($V_{bat}$<$V_{min}$), this means that the voltage $V_{bat}$ is within the voltage interval comprised between the first threshold value $V_{OFF}$ and second threshold value $V_{min}$. Battery 3 may present a problem that is able to be corrected.

An additional test protocol of battery 3 is engaged (step 26). A discharge current $I_d$ is applied to battery 3 via load 9 in order to break the passivation layer. In advantageous manner, with application of a discharge current $I_d$, counter 12 is implemented in order to know the number of occurrences of this type of problem (step 27).

The counter is configured to record the number of iterations of activation of discharge current $I_d$. As indicated above, the counter records a data item representative of the number of iterations (n). It is therefore possible to record a time, an electric charge, the number of iterations performed or another quantity.

Incrementation of the counter (step 27) can be performed before step 26, during step 26 or after step 26.

After application of discharge current $I_d$ for a predefined time, the voltage $V_{bat}$ at the terminals of battery 3 is measured again (step 21) in order to measure the variation of the voltage $V_{bat}$.

As before, the measured voltage $V_{bat}$ is compared with the first and second voltage values (steps 22 and 23).

If the voltage $V_{bat}$ is higher than the second threshold value $V_{min}$ ($V_{bat}$>$V_{min}$), battery 3 is considered as being functional. This information can be stored in memory and it is advantageous to reinitialize counter 12.

If the voltage $V_{bat}$ is lower than the first threshold value ($V_{bat}$<$V_{OFF}$), battery 3 is considered as being defective and it is advantageous to replace it. The protocol described above can be applied.

If the voltage $V_{bat}$ is within the voltage interval comprised between the first threshold value $V_{OFF}$ and second threshold value $V_{min}$, it is possible to generate a discharge current $I_d$ again.

In order to avoid repetition of the discharge current $I_d$ at the terminals of battery 3 until the voltage $V_{bat}$ is lower than the first threshold value $V_{OFF}$, it is advantageous to introduce a comparison step 28 of the value recorded in counter 12 compared with a critical value $N_C$ (n<$N_C$?). There again the position of step 28 with respect to steps 26 and 27 is of little importance.

Once the limit value $N_C$ has been reached, it is considered that battery 3 can no longer be repaired and the battery is considered as being defective (step 24). The malfunction protocol is advantageously applied in order to inform the user.

Thus, if the measured voltage $V_{bat}$ is comprised between the first and second threshold values, it is advantageous to make a comparison of the value of the counter compared with a critical value (step 28) in order to determine whether battery 3 is defective or whether a discharge current can improve the situation. This constitutes an additional criterion enabling a defective battery to be detected.

Steps 22 and 23 can be inverted in so far as it is possible to determine whether the voltage $V_{bat}$ is lower than the first threshold value $V_{OFF}$, higher than the second threshold value $V_{min}$ or within the interval indicated in the foregoing.

In advantageous embodiment, the management protocol comprises repetition of certain steps in periodic manner in order to monitor modification of the state of battery 3 over time. Advantageously, measurement of the voltage $V_{bat}$ at the terminals 3a of battery 3 is performed in periodic manner.

In an advantageous embodiment, the management protocol is triggered when a new battery 3 is connected to monitoring device 1. In this way, the user knows quickly whether the new battery 3 is functional or defective.

It is also possible to force the measurement protocol, for example by means of a user action or by pressing on a pushbutton 16 or by having recourse to a communication interface.

If battery 3 is considered as being functional, i.e. if the measured voltage is higher than the threshold $V_{min}$, it is advantageous to perform voltage measurement over a first period $\Delta t_{m1}$, for example equal to 24 h. On the other hand, battery 3 can be considered as being potentially defective if the measured voltage is lower than the threshold $V_{min}$ but higher than the threshold $V_{OFF}$.

In advantageous manner, when the voltage at the terminals of battery 3 is measured within the interval defined by the voltages $V_{min}$ and $V_{OFF}$, a discharge current $I_d$ is applied and the voltage $V_{bat}$ is measured after a predefined waiting period which follows on from stopping of discharge current $I_d$. In this case, it is possible to work with a new period which is reduced in comparison with the case where the battery is considered as being functional.

For example purposes, good results have been obtained with a period $\Delta t_m$ reduced to 19 seconds between the end of application of the current $I_d$ and measurement of the voltage $V_{bat}$.

In a particular operating mode, measurement of the voltage $V_{bat}$, performed during step 21, can be described schematically in the manner represented in FIG. 3. In the embodiment illustrated in FIG. 3, measurement of the voltage is performed in cyclic manner. The period is equal to the time $\Delta t_m$.

As indicated in the foregoing, to obtain a more accurate measurement of the voltage $V_{bat}$ at the terminals of the battery, several voltage measurements are preferably performed. For example, three voltage measurements are made.

These measurements are made at times $t_1$, $t_2$ and $t_3$ in FIG. 3. The three measurements can be separated by the same rest period or it is possible to apply a different rest period between the first and second measurements and between the second and third measurements.

In an operating mode giving good results, a waiting time at least equal to 2 ms is present between two successive voltage measurements.

In a particular operating mode, during a period, $\Delta t_m$, a discharge phase with a current equal to $I_d$ is applied. This periodic discharge phase applies current to the terminals of the battery enabling formation of a passivation layer to be reduced.

In preferential manner, the voltage measurements are made after a first waiting time $\Delta t_1$, for example at least equal to 48 ms. This first waiting time corresponds to the time separating the end of application of the current $I_d$ and the first voltage measurement $V_{bat}$. The first waiting time enables voltage measurement to be made dependable.

During the first waiting time, it is possible to apply a second current which is lower than the first current $I_d$. The second current is advantageously less than half of the first current $I_d$. It is also possible to have a zero current during the first waiting time.

During this period, there is a discharge phase with a current equal to $I_d$ from $t_0$ to $t_3$ and a rest phase at a current much lower than $I_d$ from $t_3$ to the end of the period $\Delta t_m$.

For example, good experimental results have been obtained with a period $\Delta t_m$ equal to 19 seconds and a phase $t_0$ to $t_3$, where the current is equal to Id, equal to 50 milliseconds.

Figure 4:
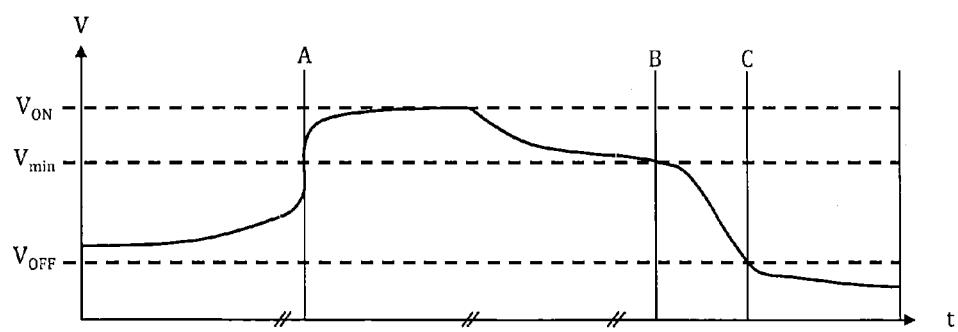
FIG. 4 represents examples of the modification of the electric voltage measured on the terminals of the battery versus time.

For example, the variation of the voltage at the terminals of the battery is represented in FIG. 4. Until the time A, the measured voltage $V_{bat}$ is comprised between the voltages $V_{OFF}$ and $V_{min}$. A doubt exists on the state of the battery which may be functional but passivated. A discharge current is applied from battery 3 until time A.

From time A and until time B, the voltage $V_{bat}$ is higher than the voltage $V_{min}$ and battery 3 is considered as being functional. Measurement of the voltage $V_{bat}$ is performed periodically.

From time B and until time C, the voltage $V_{bat}$ is comprised between the voltage $V_{min}$ and voltage $V_{OFF}$. A discharge current is again applied.

From time C, the voltage $V_{bat}$ is lower than the voltage $V_{OFF}$ and battery 3 is considered as being defective.

A device is thus provided that is efficient, simple to produce, and particularly suitable for the state of a battery 3 supplying power to a monitoring device.

The invention claimed is:

1. A monitoring device of an electric power supply system comprising:
   a series of first terminals designed to be connected to a primary power supply for supplying the monitoring device,
   a battery connected to supply the monitoring device as secondary power supply, in case of outage of the primary power supply,
   a measurer configured to measure a voltage at terminals of the battery,
   a comparator configured to compare the voltage measured by the measurer with first and second threshold values representing respectively a defective battery and a functional battery, an output of the comparator being coupled to a management circuit, a switch configured to disable/enable flow of a discharge current at the terminals of the battery, a counter configured to count a quantity representative of the discharge current, an output of the counter being coupled to the management circuit, the management circuit configured to initiate measurement of the voltage at terminals of the battery when the monitoring device is supplied by the primary power supply, to control state of the switch according to the comparison of the measured voltage with the first and second threshold values and according to a value of the counter so as to detect a malfunctioning of the battery.

2. A circuit breaker comprising a monitoring device according to claim 1.

3. The circuit breaker according to claim 2 comprising a storage circuit configured to record indicators linked to the causes of tripping of the circuit breaker and supplied by the battery.

4. A management method of discharge of a battery in a monitoring device comprising the following steps:

providing a monitoring device of an electric power supply equipped:

with a first series of terminals designed to be connected to a primary electric power supply, with a storage circuit configured to record indicators linked to measured electric quantities of the electric power supply, with a battery connected to supply at least a part of the storage circuit in case of outage of the primary electric power supply, with a measurer configured to measure a voltage at terminals of the battery, with a management circuit connected to the measurer and configured to detect a malfunctioning of the battery, a counter configured to count a quantity representative of a discharge current applied to the terminals of the battery, an output of the counter being coupled to the management circuit, detecting the presence of the battery, measuring the voltage at the terminals of the battery, comparing the voltage measured at the terminals of the battery with first and second threshold values representing respectively a defective battery and a functional battery, applying the discharge current to the terminals of the battery if the measured voltage is comprised between the first and second threshold values.

5. The management method according to claim 4, wherein the voltage measured at the terminals of the battery is lower than the first threshold value, the battery is considered as being defective by the management circuit.

6. The management method according to claim 4, further comprising the following steps:

counting a number of iterations of application of the discharge current, comparing said number of iterations with a critical value, considering the battery as being defective if said number of iterations is equal to the critical value.

7. The management method according to claim 4, characterized in that the discharge current is a periodic current with an alternation of discharge periods at a first current and of rest periods at a second current lower than the first current or at zero current.

8. The management method according to claim 4, wherein the discharge current is equal to 3 mA.

* * * * *